US007831950B2

(12) United States Patent
Kashiwakura

(10) Patent No.: US 7,831,950 B2
(45) Date of Patent: Nov. 9, 2010

(54) METHOD AND SYSTEM FOR DESIGNING PRINTED CIRCUIT BOARD FOR ELECTRONIC CIRCUIT

(75) Inventor: Kazuhiro Kashiwakura, Tokyo (JP)

(73) Assignee: NEC Corporation, Tokyo (JP)

( * ) Notice: Subject to any disclaimer, the term of this patent is extended or adjusted under 35 U.S.C. 154(b) by 409 days.

(21) Appl. No.: 11/951,514

(22) Filed: Dec. 6, 2007

(65) Prior Publication Data

US 2008/0141209 A1   Jun. 12, 2008

(30) Foreign Application Priority Data

Dec. 6, 2006   (JP)   .............................. 2006-329386

(51) Int. Cl.
*G06F 17/50* (2006.01)
*H03K 17/693* (2006.01)
(52) U.S. Cl. .............................. 716/15; 716/10; 716/11; 716/12
(58) Field of Classification Search .................. 716/15, 716/10, 11, 12
See application file for complete search history.

(56) References Cited

U.S. PATENT DOCUMENTS

| | | | | |
|---|---|---|---|---|
| 7,398,500 B1 * | 7/2008 | Gupta et al. | ................... | 716/15 |
| 7,444,612 B2 * | 10/2008 | Ariyama et al. | ............... | 716/15 |
| 2008/0141183 A1 * | 6/2008 | Kumagai | ........................ | 716/1 |
| 2008/0141205 A1 * | 6/2008 | Kumagai | ..................... | 716/11 |

FOREIGN PATENT DOCUMENTS

| | | |
|---|---|---|
| JP | 07056980 A | 3/1995 |
| WO | 2004046975 A1 | 3/2004 |

* cited by examiner

*Primary Examiner*—Vuthe Siek
*Assistant Examiner*—Magid Y Dimyan

(57) ABSTRACT

Disclosed is a method including a step for selecting a component, a step for preparing a timing database including terminal information, input/output attribute and AC specifications of the component selected, a step for creating a circuit diagram from circuit design information, a step for extracting connection information and performing timing verification, when component connection has been determined, a step for performing layout design including the placement and routing of the components, a step for extracting wiring lengths of a data line and a clock line for the components from a net list and the layout information to derive the wiring delay time of the data and clock lines, a step for checking, from the wiring delay time derived, whether or not a timing constraint for the component is met.

15 Claims, 5 Drawing Sheets

FIG.3B FOR CLOCK DRIVER

| TERMINAL NUMBER | TERMINAL NAME | INPUT/OUTPUT ATTRIBUTE | PLL ATTRIBUTE |
|---|---|---|---|
| 1 | AGND | - | - |
| 2 | VCC | - | - |
| 3 | IN0 | O | - |
| 4 | IY1 | O | PLL |
| 5 | IY2 | O | PLL |
| 6 | GND | - | - |
| 7 | GND | - | - |
| 8 | IY3 | O | PLL |
| 9 | IY4 | O | PLL |
| 10 | VCC | - | - |
| 11 | G | - | - |
| 12 | FBOUT | O | FBO |
| 13 | FBIN | I | FB |
| 14 | VCC | - | - |
| 15 | IY5 | O | PLL |
| 16 | IY6 | O | PLL |
| 17 | IY7 | O | PLL |
| 18 | GND | - | - |
| 19 | GND | - | - |
| 20 | IY8 | O | PLL |
| 21 | IY9 | O | PLL |
| 22 | VCC | - | - |
| 23 | AVCC | - | - |
| 24 | CLK | I | REF |

FIG.3A FOR GENERAL IC

| TERMINAL NUMBER | TERMINAL NAME | INPUT/OUTPUT ATTRIBUTE | SETUP TIME (Ts) | HOLD TIME (Th) | ACCESS TIME (Tac) | OUTPUT HOLD TIME (Toh) | REFERENCE TERMINAL NAME |
|---|---|---|---|---|---|---|---|
| 1 | VDD | - | - | - | - | - | - |
| 2 | DQ0 | I/O | 1.5n | 0.8n | 6n | 3n | CLOCK |
| 3 | VDDQ | - | - | - | - | - | - |
| 4 | DQ1 | I/O | 1.5n | 0.8n | 6n | 3n | CLOCK |
| 5 | DQ2 | I/O | 1.5n | 0.8n | 6n | 3n | COCLK |
| 6 | VSSQ | - | - | - | - | - | - |
| 7 | DQ3 | I/O | 1.5n | 0.8n | 6n | 3n | CLOCK |
| 8 | DQ4 | I/O | 1.5n | 0.8n | 6n | 3n | CLOCK |
| 9 | VDDQ | - | - | - | - | - | - |
| 10 | DQ5 | I/O | 1.5n | 0.8n | 6n | 3n | CLOCK |
| 11 | DQ6 | I/O | 1.5n | 0.8n | 6n | 3n | CLOCK |
| 12 | VSSQ | - | - | - | - | - | - |
| 13 | DQ7 | I/O | 1.5n | 0.8n | 6n | 3n | CLOCK |
| 14 | VDD | - | - | - | - | - | - |
| 15 | DQML | I | 1.5n | 0.8n | - | - | CLOCK |
| 16 | WE# | I | 1.5n | 0.8n | - | - | CLOCK |
| 17 | CAS# | I | 1.5n | 0.8n | - | - | CLOCK |
| 18 | RAS# | I | 1.5n | 0.8n | - | - | CLOCK |
| 19 | CS# | I | 1.5n | 0.8n | - | - | CLOCK |
| 20 | BA0 | I | 1.5n | 0.8n | - | - | CLOCK |
| 21 | BA1 | I | 1.5n | 0.8n | - | - | CLOCK |
| 22 | A10 | I | 1.5n | 0.8n | - | - | CLOCK |
| 23 | A0 | I | 1.5n | 0.8n | - | - | CLOCK |
| 24 | A1 | I | 1.5n | 0.8n | - | - | CLOCK |
| 25 | A2 | I | 1.5n | 0.8n | - | - | CLOCK |
| 26 | A3 | I | 1.5n | 0.8n | - | - | CLOCK |
| 27 | VDD | - | - | - | - | - | - |
| 28 | VSS | - | - | - | - | - | - |
| 29 | A4 | I | 1.5n | 0.8n | - | - | CLOCK |
| 30 | A5 | I | 1.5n | 0.8n | - | - | CLOCK |
| 31 | A6 | I | 1.5n | 0.8n | - | - | CLOCK |
| 32 | A7 | I | 1.5n | 0.8n | - | - | CLOCK |
| 33 | A8 | I | 1.5n | 0.8n | - | - | CLOCK |
| 34 | A9 | I | 1.5n | 0.8n | - | - | CLOCK |
| 35 | A11 | I | 1.5n | 0.8n | - | - | CLOCK |
| 36 | A12 | I | 1.5n | 0.8n | - | - | CLOCK |
| 37 | CKE | I | 1.5n | 0.8n | - | - | CLOCK |
| 38 | CLK | I | - | - | - | - | - |
| 39 | SQMH | I | 1.5n | 0.8n | - | - | CLOCK |
| 40 | NC | - | - | - | - | - | - |

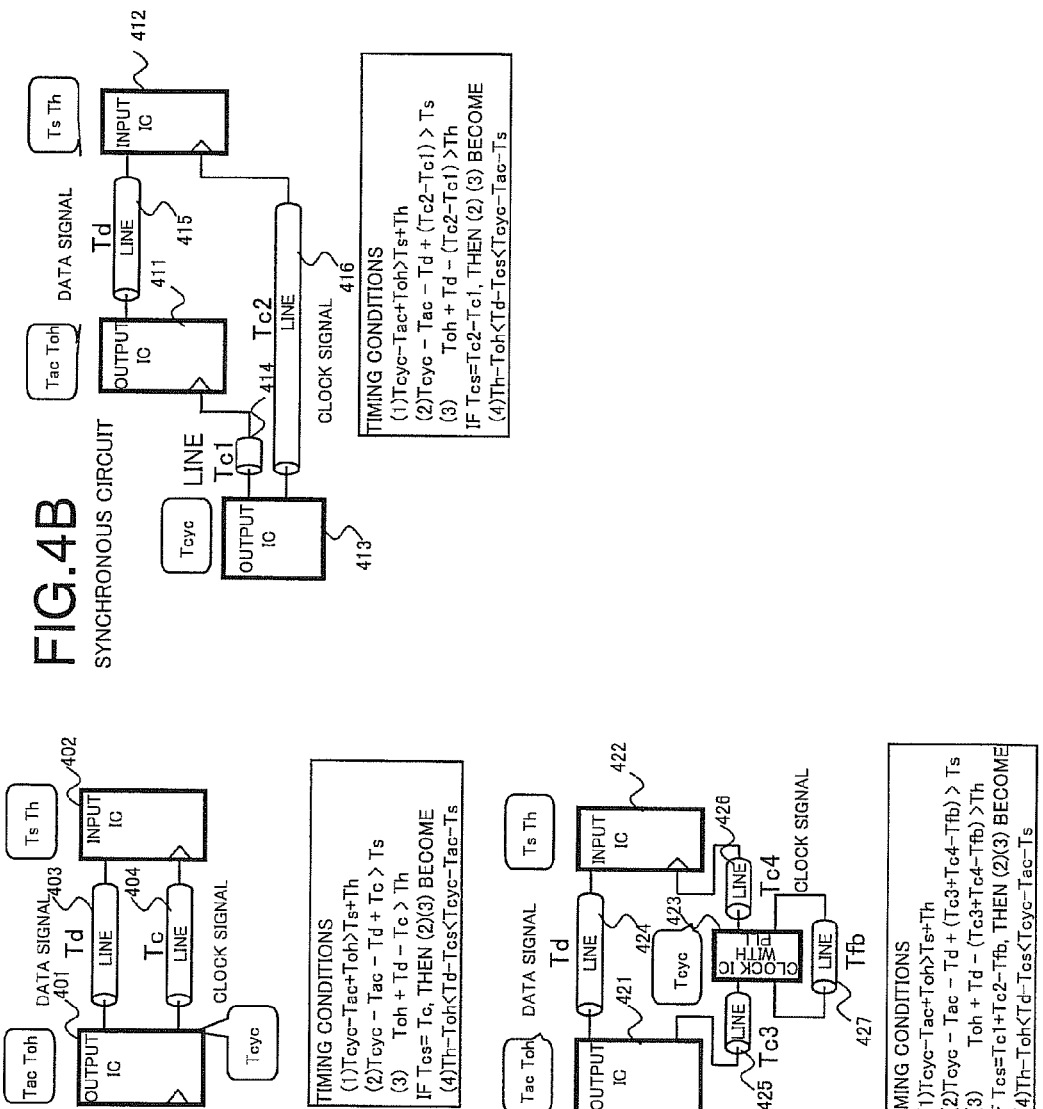

METHOD AND SYSTEM FOR DESIGNING PRINTED CIRCUIT BOARD FOR ELECTRONIC CIRCUIT

REFERENCE TO RELATED APPLICATION

This application is based upon and claims the benefit of the priority of Japanese patent application No. 2006-329386, filed on Dec. 6, 2006, the disclosure of which is incorporated herein in its entirety by reference thereto.

FIELD OF THE INVENTION

This invention relates to a designing technique for placement and routing of electronic circuits. More particularly, it relates to a method and a system that may suitably be used for floor planning of a printed circuit board for electronic circuits.

Recently, marked progress has been achieved in the field of semiconductor devices, such as ICs or LSIs, relating to high integration and miniaturization process, such as reduction of a gate length of a transistor. Moreover, the operating frequency is also increasing appreciably. An increased operating speed of a semiconductor device, that is, an increased driving clock frequency, has made the design of electronic circuits more difficult.

In the design of the printed circuit board, the delay caused by the wiring in the printed circuit board has become non-negligible with reduction in the clock period, such that, depending on the routing on the printed circuit board, it may become impossible to satisfy AC specifications for semiconductor devices.

Patent Document 1 (JP Patent Kokai Publication No. JP-A-7-56980) discloses a technique for storing timing conditions in a component library. However, with this technique, a user has to input results calculated from AC specifications of ICs (LSIs) manually such that mistakes are highly likely to be produced due to miscalculations or inadvertent errors.

Patent Document 2 (WO2004/046975A1 discloses a technique for improving the timing of designing of electronic circuits following cell placement and routing. With this technique, it is necessary to replace cells or buffers to improve the timing.

[Patent Document 1]
JP Patent Kokai Publication No. JP-A-7-56980
[Patent Document 2]
WO2004/046975A1

SUMMARY OF THE DISCLOSURE

The following analyses on the related art are given by the present invention. The entire disclosure of Patent Documents 1 and 2 is incorporated herein by reference thereto.

It may not be too much to say that, with the increasing operating speed of semiconductor components, good or bad results of the design of the printed circuit boards govern the success or failure of design of electronic circuits.

Accordingly, it is an object of the present invention to provide design method and system in which circuit design and layout design, by which AC specifications that is, timing conditions are satisfied, may be achieved semi-automatically to provide for a stabilized circuit operation.

The invention, disclosed in the present application, substantially has the following configuration.

In accordance with one aspect of the present invention, there is provided a method for designing a printed circuit board for an electronic circuit comprising:

(a) creating a timing database including terminal information, input/output attribute and timing information relating to a selected component;
(b) generating a circuit diagram based on circuit design information;
(c) extracting connection information of a component from said circuit diagram, and performing timing verification with reference to said timing database to check whether or not the component is connectable from timing perspective;
(d) carrying out layout design of the printed circuit board, inclusive of placement and routing of a component which is decided to be connectable as a result of said timing verification;
(e) extracting line lengths of a data line and a clock line in said printed circuit board obtained by said layout design from a net list and layout information thereof to derive respective wiring delay times of said data line and said clock line; and
(f) checking, with reference to the wiring delay times derived and the timing database, whether or not delays on the data line and the clock line satisfy a preset timing constraint.

In the method according to the present invention, if, as a result of the timing verification in the step (c), said component is decided to be not connectable, another component is selected and the step (a) for creating the timing database for another component is executed.

In the method according to the present invention, it is checked in said timing verification in the step (c), whether or not a valid pulse width of an output buffer of a component that outputs data is larger than the sum of the setup time and the hold time of an input buffer of a component that receives the data.

In the method according to the present invention, in the step (f), in case operating frequency information is input and a clock cycle is Tcyc; and as the timing information of the component stored in said timing database, a setup time of an input buffer of the component that receives data, is Ts, a hold time of the input buffer of the component that receives data, is Th, an output hold time of an output buffer of the component that outputs data, is Toh, and an access time of the output buffer of the component that outputs data, is Tac; and in case said wiring delay times derived include a delay Td of the data line between the component outputting the data and the component receiving the data, and a delay Tcs of the clock line between the component outputting the data and the component receiving the data;

said checking whether or not the delay on said data line and said clock line satisfies said timing constraint is performed by checking whether or not $$Th-Toh<Td-Tcs<Tcyc-Tac-Ts$$

holds.

In the method according to the present invention, if, as a result of the timing verification in the step (f), a component has been judged to be not proper, processing may go back to the step (d) to perform again the layout design including placement and routing of the component.

In another aspect of the present invention, there is provided a system for designing a printed circuit board for an electronic circuit comprising:

a first means that creates a timing database including terminal information, input/output attribute and timing information relating a selected component;

a second means that extracts connection information of a component from a circuit diagram that has been generated based on circuit design information, and performs timing verification, with reference to said timing database, to check whether or not the component is connectable from timing perspective;

a third means that extracts respective line lengths of a data line and a clock line from a net list and layout information of a printed circuit board that has been layout-designed to derive respective wiring delay times of said data line and said clock line; and a fourth means that checks, with reference to the wiring delay times derived and the timing database, whether or not delays on the data line and the clock line satisfy a preset timing constraint.

In the system according to the present invention, when said second means decides as a result of said timing verification that the component is be not connectable, a timing database including terminal information, input/output attribute and timing information relating to another component selected anew is created.

In the system according to the present invention, the second means may check whether or not a valid pulse width of an output buffer of a component outputting data is larger than the sum of a setup time and a hold time of an input buffer of a component receiving the data.

In the system according to the present invention, the fourth means may receive operating frequency information; wherein, in case the clock cycle is Tcyc, and in case, as the timing information for the components, stored in the timing database, a setup time of an input buffer of a component receiving the data is Ts, a hold time of the input buffer of the component, receiving data, is Th, an output hold time of an output buffer of a component, outputting the data, is Toh, and an access time of the output buffer of a component, outputting the data, is Tac, and in case the wiring delay times derived include the delay Td of a data line between a component outputting the data and a component receiving the data, and the delay Tcs of a clock line between a component outputting the data and a component receiving the data, the fourth means checks whether or not $$Th-Toh<Td-Tcs<Tcyc-Tac-Ts$$

holds, to verify whether or not the delay on the data line and the clock line between the components satisfies the timing constraints.

In the system according to the present invention, if as a result of the verification by the fourth means, a component has been judged to be not proper, the layout design including placement and routing of the component may again be carried out.

In a further aspect according to the present invention, there is provided a system for designing a printed circuit board for an electronic circuit comprising:

first means that extracts respective wiring lengths of a data line and a clock line for at least a first component and a second component of an electronic circuit being layout designed or following layout design, from a net list and layout information; wherein said first component outputs data responsive to a clock signal and said second component samples the data responsive to the clock signal;

said first means deriving wiring delay time of said data line and wiring delay time of said clock line; and second means that verifies, from the wiring delay times derived, timing information of said first and second components and information on operating frequency thereof, whether or not the delay on said data line and said clock line between said first and second components satisfies a preset timing constraint.

The system according to the present invention may further comprise third means for performing timing verification of the component, before proceeding to layout design, based on connection information of the component and on timing information, to check whether or not the first and second components are connectable to each other. Preferably, the third means judges that the first and second components are connectable to each other when the valid pulse width of the first component is larger than the sum of the setup time and the hold time of the second component.

In the system of the present invention, in case the clock cycle is Tcyc and, as AC characteristics of the first and second components, the setup time of the second component is Ts, the hold time of the second component is Th, the output hold time of the first component is Toh, and the access time of the first component is Tac, the delay of a data line between the first and second components being Td, and the delay of a clock line between the first and second components being Tcs, the second means may check whether or not $$Th-Toh<Td-Tcs<Tcyc-Tac-Ts$$

holds, to verify whether or not the timing constraint for the first and second components is met.

The meritorious effects of the present invention are summarized as follows.

According to the present invention, it is possible to semi-automatically execute circuit design and layout design that satisfy AC specifications (timing conditions). The circuit operation may be stabilized by interconnecting the components (ICs or LSIs) as the AC specifications of the respective components are taken into account.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 3A and 3B are diagrams showing an example of a timing database.

FIGS. 4A to 4C are schematic views showing an example of timing relationships among different components.

PREFERRED MODES OF THE INVENTION

The present invention will now be described in more detail with reference to the accompanying drawings. In the circuit design, according to the present invention, a timing database is prepared for each of components (ICs and LSIs), from the AC specifications for components (ICs and LSIs). By checking whether or not the components are connectable in a circuit design, a proper routing condition in a layout design is provided.

The design method according to the present invention substantially comprises the following three phases:
(1) a phase of extracting setup time, hold time, access time, output hold time and reference signal, from a datasheet of the components, and preparing a timing database (timing library);
(2) a phase of extracting connection information from a circuit diagram to decide whether or not an input IC may be connected to an output IC from the timing perspective; and
(3) a phase of carrying out component placement and prediction of wiring length and delay time to determine whether or not the timing conditions are optimum.

Figure 1:
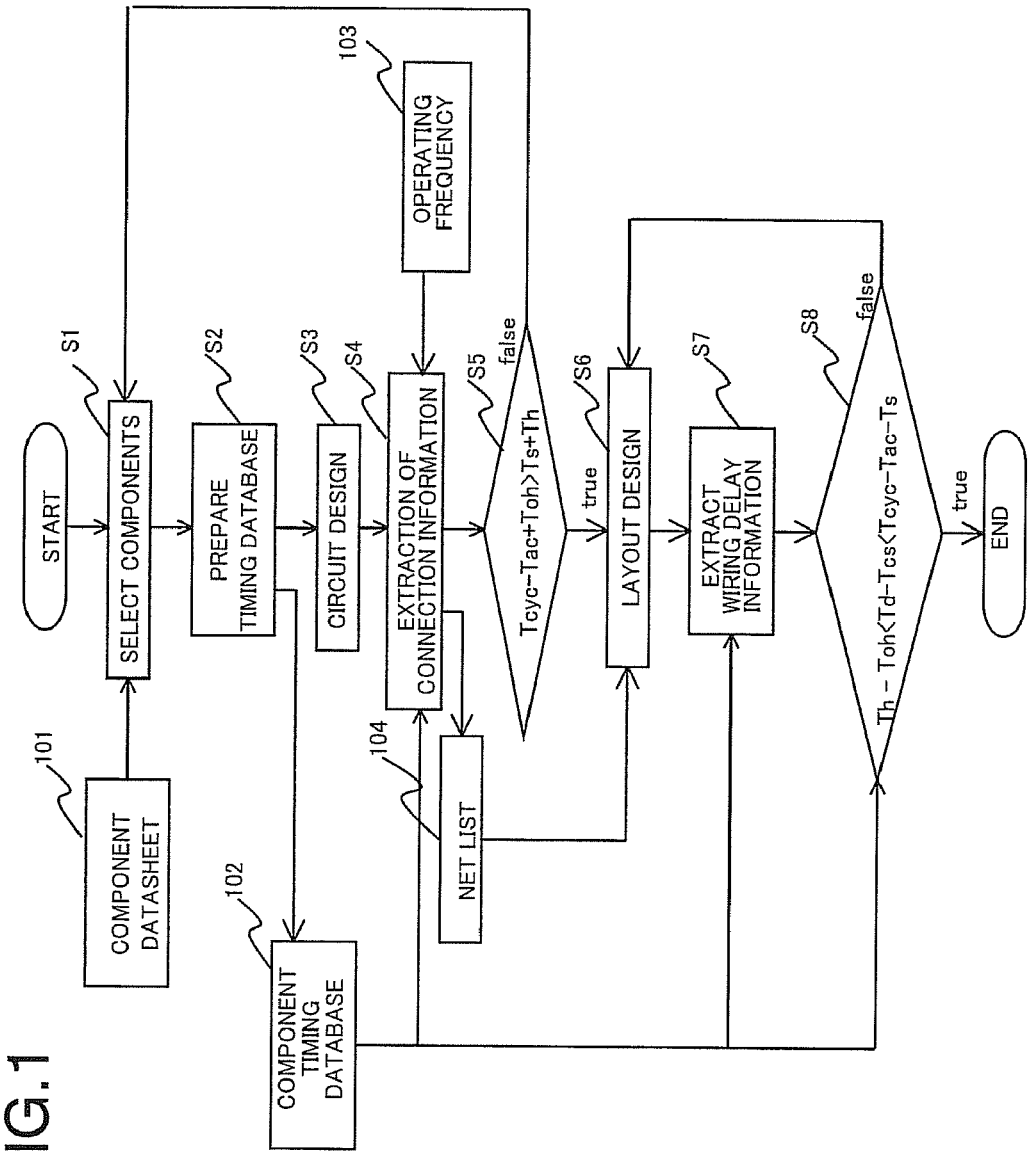
FIG. 1 is a flowchart for illustrating the configuration and the processing, in their entirety, according to an example of the present invention.

The system of the present invention includes means for executing, before proceeding to layout design, the processing of checking whether or not a first component and a second component are connectable, from the timing perspective, based on the component connection information in the circuit diagram and on the timing information (AC specifications) of the timing databases of the components (S4 and S5 of FIG. 1). The first component outputs data responsive to a clock signal, and the second component samples the data supplied from the first component. More specifically, the system checks whether or not the timing constraint that a valid pulse width of the first component is larger than the sum of setup time and hold time of the second component.

The system of the present invention includes means for carrying out the processing (S7 of FIG. 1) for extracting respective wiring lengths of a data line and a clock line relating to at least the first component and the second component of an electronic circuit in layout design stage or after the layout design stage, from a net list and the layout information, and for deriving wiring delay time of the data line and wiring delay time of the clock line. The system of the present invention also includes means for carrying out the processing (S8 of FIG. 1) of verifying, from the wiring delay time derived, the information of the AC specifications of the first and second components and the information on the operating frequency, whether or not the delay on the data line and the clock line between the first and second components satisfies preset timing constraint.

The present invention provides means for detecting an error in component selection in a circuit design stage to achieve an automatic timing design in a component placement stage, thus assuring stable design quality even on the occasions of the increased operating speed of semiconductor components (ICs or LSIs). The present invention will now be described based on specified examples.

FIG. 1 is a flowchart for illustrating an example of the present invention. The flowchart of FIG. 1 shows process steps from circuit design to layout design, by way of illustration of the overall processing in the design system of the present example. In the present example, the process steps are divided substantially into the following three phases:

<Phase 1>
Components are selected (step S1) and a timing database is prepared (step S2).

<Phase 2>
The circuit design is performed (step S3) and circuit connection information is extracted (step S4). Based on the timing database, the signals that cannot be connected are collated (step S5). If there is any signal(s) that cannot be connected, an alarm is issued to return to the processing to the component selection step (step S1).

<Phase 3>
The layout design is made (step S6) and wiring delay information is extracted (step S7). Then, based on the timing database, it is checked whether or not the timing condition can be satisfied (step S8). If the timing condition cannot be satisfied, an alarm is issued, in which case the processing reverts to the layout design by way of feedback (step S6).

The respective phases will now be described.

Figure 2:
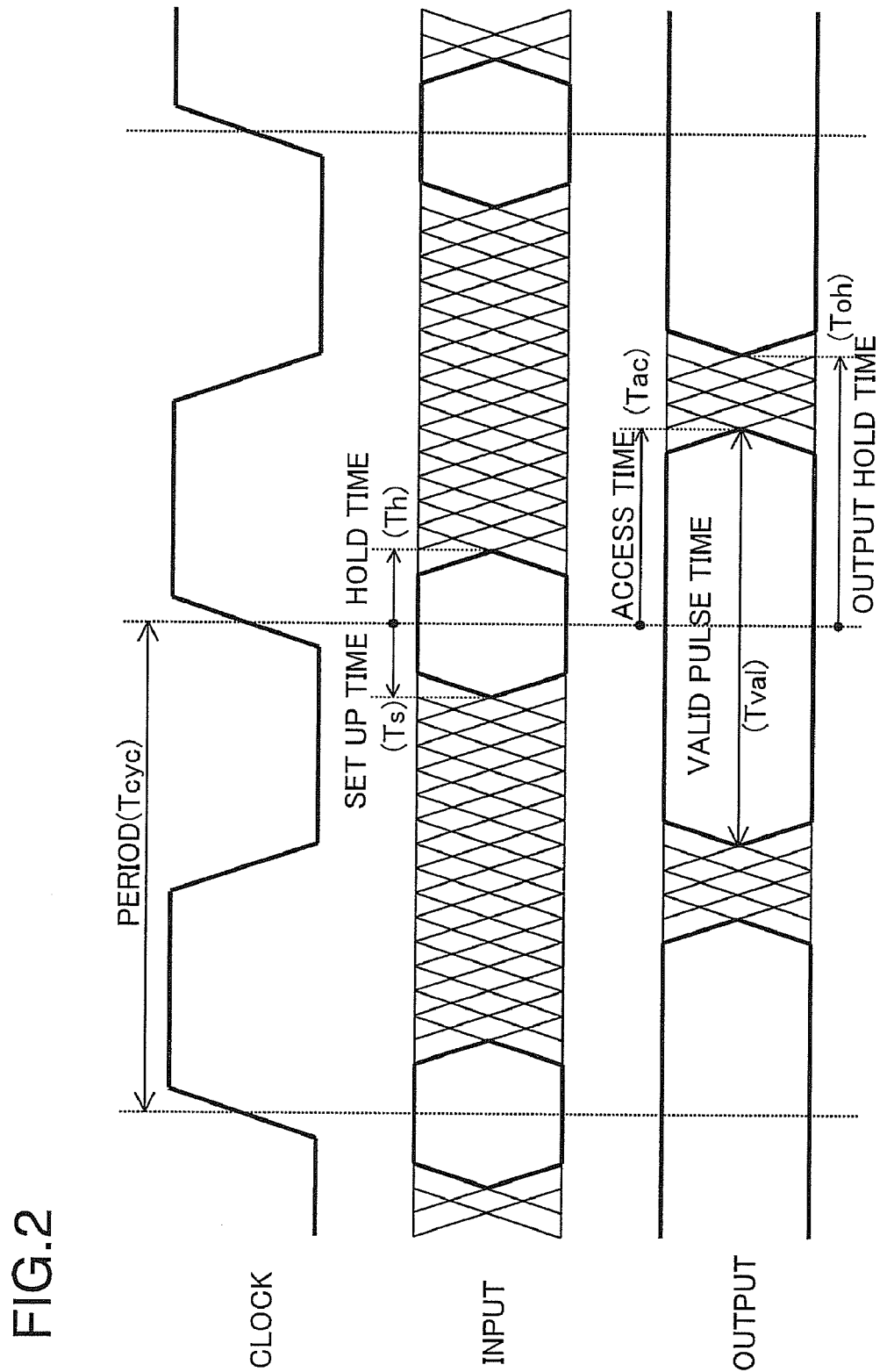
FIG. 2 is a graph showing an example of a timing chart of a device.

<Selection of Components>
In selecting the components, datasheets supplied by IC vendors are referenced and used to verify whether or not desired specifications can be met. Meanwhile, the 'IC' (Integrated Circuit) herein encompasses LSIs and memory devices and so forth. The datasheet of a component is also used to extract the AC specifications of the component, that is, the specifications for timing information inclusive of setup time and hold time, in case the component has been determined to be adopted. In general, the AC specifications are shown in a timing chart shown for example in FIG. 2. As regards an input buffer, setup time (Ts) and hold time (Th) are prescribed with respect to a reference signal, which in FIG. 2 is CLOCK. As regards an output buffer, access time (Tac) and output hold time (Toh) are prescribed with respect to the reference signal. The AC specifications may be prescribed in a different way from that shown above, depending on the sorts of the datasheets for ICs. In such case, the AC specifications may be interpreted from time to time in the different way. The setup time (Ts) is the minimum time during which the input signal (INPUT) must be kept stably, before the timing of an effective clock edge, in order to correctly sample the input signal in a latch, for instance. The hold time (Th) is the minimum time during which the input signal must be held stably, from the effective clock edge, in order to correctly sample the input signal in a latch, for instance. The valid pulse time (Tva1) is a pulse width of an output signal (OUTPUT) (in FIG. 2, the minimum time of a pulse width prescribed from the leading edge of the pulse of the output signal to its trailing edge). The access time (Tac) is the time from the effective edge of the clock (CLOCK) to the shortest trailing edge of the pulse of the output signal (OUTPUT). The output hold time (Toh) is the time from the effective edge of the clock (CLOCK) to the rearmost trailing edge of the pulse of the output signal (OUTPUT). The time from the leading edge prescribing the valid pulse period of the output signal (OUTPUT) to the rearmost trailing edge corresponds to one clock period Tcyc.

<Preparation of Timing Database>
From the AC specifications, read from the datasheet, the terminal number, terminal name, input/output attribute (I (input) pin, O (output pin) and I/O (input/output) pin), setup time, hold time, access time, output hold time and reference terminal name, are extracted and stored in respective columns of a database, as shown in FIG. 3A. 'CLOCK' in the column of the reference terminal name, as in DQ0 to DQ7, indicate that the terminal referenced by the AC specifications, such as the setup time or the hold time, is CLOCK (terminal CLK). As for power supply terminals VDD, VDDQ, VSS and VSSQ, only terminal numbers and terminal names are prescribed. As for the clock, the terminal number and terminal name CLK are similarly prescribed. A component timing database 102 is prepared from one component to another and registered in association with a library for circuit design or with a library for packaging design.

The information relating to a clock driver equipped with a PLL (Phase Locked Loops), is stored into the database so that the PLL will be individually recognized. In an example shown in FIG. 3B, the PLL attribute of terminal names 1Y1 to 1Y7, for instance, is prescribed as 'PLL' and an output clock from the PLL is used. The terminal name CLK is a reference clock of the PLL and has an attribute REF. A terminal name FBOUT, with the PLL attribute of FBO, is a feedback output of the PLL, whereas a terminal name FBIN, with the PLL attribute of FBI, is its feedback input.

<Creation of Circuit Diagram>

In a circuit design step (step S3 of FIG. 1), a library for circuit design, not shown, is called and added to with a condition for connection between two circuit terminals to create a circuit diagram. The operating frequency or period of the circuit is needed in the timing design, and hence is input as an attribute in the clock signal of the circuit diagram.

<Extraction of Connection Information>

In the step of extracting the connection information (step S4 of FIG. 1), the timing checking is carried out at a time point when the inputting of the entire circuit diagram has been completed, or when the connection information between two semiconductor devices and the connection information of the reference signal (clock) have been determined.

FIGS. 4A to 4C show examples of synchronization configurations using a clock signal. At the stage of the circuit design, wiring delay times (Td, Tc, Tc1, Tc2 and Tfb in the drawing) cannot be prescribed. Hence, it is confirmed that the valid pulse time of the output buffer is larger than the sum of the setup time and the hold time of the input buffer (latch).

Referring to FIG. 2, the valid pulse time Tva1 of the output buffer is expressed by the clock period Tcyc minus the access time Tac plus the output hold time Toh:

$$Tva1 = Tcyc - Tac + Toh \quad (1).$$

The sum of the setup time and the hold time of a receive buffer (latch), or Ts+Th, is the pulse time needed for the receive buffer, and hence must satisfy the following relationship:

$$Tcyc - Tac + Toh > Ts + Th \quad (2).$$

If this relationship may not be satisfied, it indicates a component selection error. This decision is carried out for all of the components registered in the component timing database (102 of FIG. 1) to prohibit circuit design in which connections are physically impossible.

A net list (104 of FIG. 1) is output as the result of extraction of the connection information for use in the layout design.

<Layout Design>

In the step of the layout design of FIG. 1 (step S6), placement of components and routing design among the components are carried out.

<Extraction of Wiring Delay Information>

In the step of extraction of the wiring delay information of FIG. 1 (step S7), wiring lengths for clock and data signals are extracted from the net list and the layout design information to calculate the wiring delay time.

This processing of extracting the wiring delay information may be carried out when the layout design in its entirety has been completed. Or, the processing of extracting the wiring delay information may be carried out at a stage during the routing step in the course of the layout design when preset conditions are met.

The propagation delay time $\tau$ per unit length of a line of the same dielectric constant is constant, with the delay time being proportionate to the wiring length. The wiring delay time may readily be calculated by extracting the wiring length. In a commonly used glass epoxy substrate (FR-4), the wiring delay $\tau$ is on the order of 7 ns/m.

In case a delay time prediction line in a branched wiring is branched, the wiring delay time may be calculated using transmission simulation, for instance. However, if transmission simulation is carried out at the same time as layout design is carried out, the operation efficiency tends to be lowered.

Thus, in the present example, the wiring delay time is found by a simplified technique which is now described.

Figure 5:
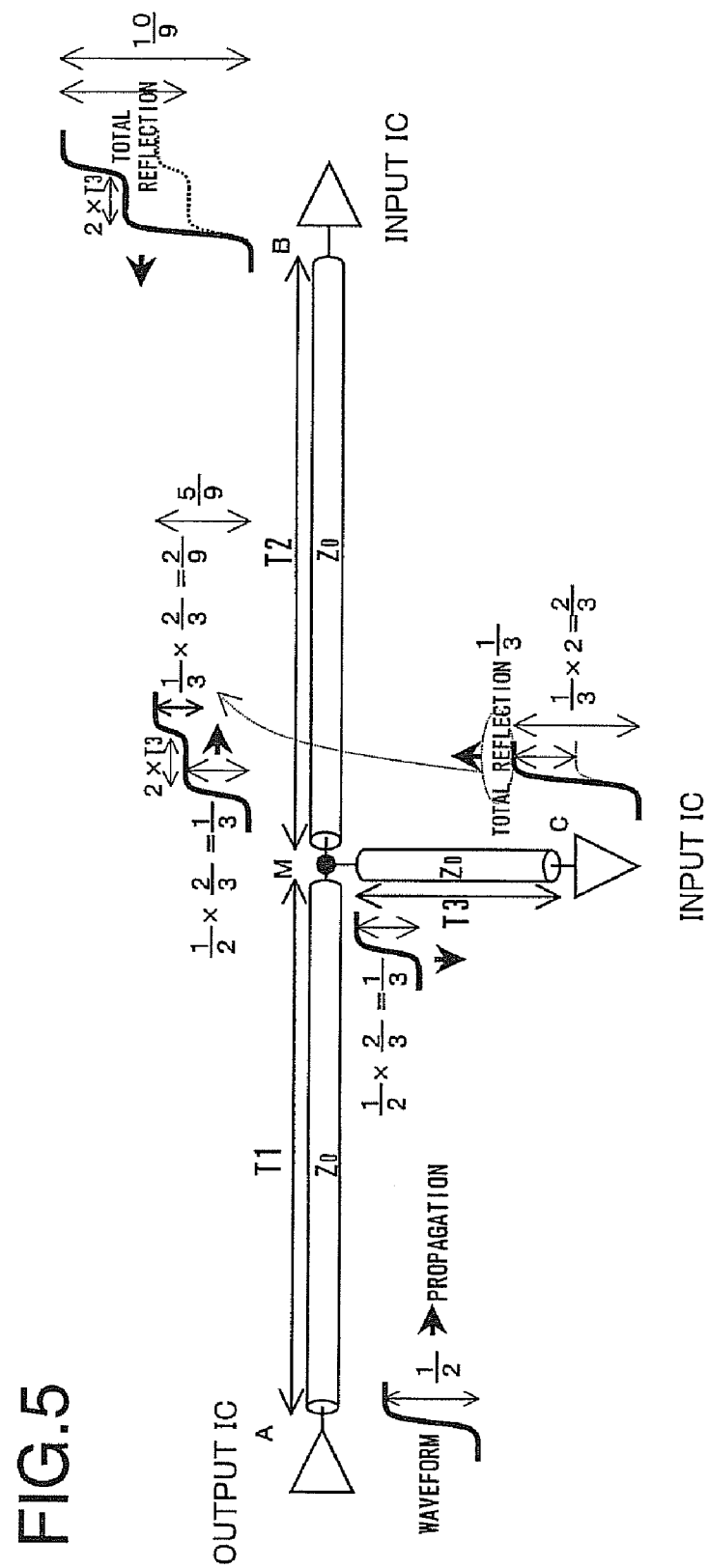
FIG. 5 is a schematic view showing an example of computation of delay time on branch lines used in the present example.

FIG. 5 shows a configuration in which two input ICs are connected to a sole output IC.

The delay time from an output end A of the output IC to a branch point M is denoted by T1, that from the branch point M to an input end B of the input IC is denoted by T2, and that from the branch point M to an input end C of the input IC is denoted by T3. The respective lines have common characteristic impedance $Z_0$.

In the following, the propagation delay caused in propagation from the point A to the point B is examined. A waveform with an amplitude equal to ½ is driven from the output IC on a line AM. In setting the amplitude to ½, it is presupposed that the output impedance is matched to the characteristic impedance $Z_0$ of the line.

After time T1, the waveform reaches the branch point M. When looking from the point A towards the point M, the line after the point M appears to be a line with a characteristic impedance of $Z_0/2$, because the line with the characteristic impedance of $Z_0$ is branched into two lines.

From the relationships of the reflection and transmission of $$\text{reflection coefficient} = (Z_0/2 - Z_0)/(Z_0/2 + Z_0) = -1/3 \quad (3)$$

$$\text{transmission coefficient} = 2 \times Z_0(Z_0/2 + Z_0) = 4/3 \quad (4)$$

the signal transmitted after the point M is of am amplitude of 4/3. However, since the line is branched into two, the amplitude is ⅔ per branched line.

Thus, waveforms of $$\text{amplitude } (½) \times \text{transmission coefficient } (4/3) \div 2 = (\text{amplitude}) \, ⅓ \quad (5)$$

are transmitted on lines MB and MC, respectively.

If attention is directed to the waveform proceeding to the point C, the waveform propagated with an amplitude of ⅓ is totally reflected at the point C, because of the high input impedance of the input IC, and hence has the amplitude doubled (⅓×2=⅔). Consequently, the reflected waveform, with the amplitude of ⅓, is returned back to the point M, where it is further reflected and transmitted.

The signal branched by 1:2 is transmitted with the amplitude of ⅓, as described above. Hence, the waveform proceeding from M through C back to M (M-->C-->M) is $$\text{amplitude } (⅓) \times \text{transmission } (⅔) = 2/9 \quad (6)$$

and hence is overlapped with the waveform inherently proceeding from the point M to the point B.

However, since the waveform is offset by time 2×T3 during which the waveform travels from M through C back to M (M-->C-->M), the waveform has an amplitude of $$5/9 (= 1/3 + 2/9) \quad (7)$$

and has a stepped distortion during the time equal to time 2×T3.

When this waveform reaches the point B, it is subjected again to total reflection. Hence, the waveform with the amplitude of $$10/9 (= 5/9 \times 2)$$

is received by the input IC.

If the time that elapses until the waveform becomes stabilized is thought of as the propagation delay, the time is the sum of T1 (time of A-->M), 2×T3 (time of M-->C-->M) and T2 (time of M-->B). Hence, the delay time of $$A \to B = T1 + 2 \times T3 + T2 \quad (9).$$

The same applies for the propagation delay from the point A to the point C. Hence, the delay time of $$A \to C = T1 + 2 \times T2 + T3 \quad (10).$$

Hence, the delay time may be expressed by an equation in terms of the wiring length. With the propagation delay time per unit length of τ, the wiring length of the main line L and the length of an i'th branch line is Ls(i), i being an optional natural number, the delay time may be expressed by the following equation (11):

$$\text{delay time} = \tau L + 2\tau \Sigma i L s(i) \quad (11)$$

It is noted that the length of the main line L is the length from the output IC to the target input IC and, if the point C in FIG. 5 is a target, the main line length is equivalent to AM+MC.

In the above equation, Σi is an operator for sum (sum for i). Meanwhile, if the branch line is branched, the equation (11) is applied to the branch line.

It is noted that prediction of the wire length delay time is to be applied only to the data line, while it may not be applied to a clock signal.

The reason is that the clock signal has significance in its voltage transition, and that distortion in the rising edge and/or the falling edge of the clock signal may give rise to malfunctions.

The timing condition is collated as to its validity based on the delay information extracted from the net list and the layout design.

As shown in an illustrative timing design of FIGS. 4A to 4C, the timing conditions, which take account of the wiring delay, may be defined from the setup condition and the hold condition, as will now be described.

In a source synchronous circuit, shown in FIG. 4A, a data signal from an output IC 401 is supplied through line 403 to an input IC 402, whereas a clock signal from the output IC 401 is supplied through line 404 to the input IC 402.

Assuming that delay times of the lines 403 and 404 are Td and Tc, respectively, a clock period is Tcyc, an access time is Tac and that an output hold time of the output IC 401 is Toh, the setup time Ts and the hold time Th of the input IC 402 (latch) need to satisfy the relationships of the following equations (12) and (13):

$$Tcyc - Tac - Td + Tc > Ts \quad (12)$$

$$Toh + Td - Tc > Th \quad (13).$$

From the equations (12) and (13), $$Th - Toh < Td - Tc < Tcyc - Tac - Ts \quad (14).$$

If, in a synchronous circuit of FIG. 4B, the delay time on a line 414 from a clock IC 413 to a clock terminal of an output IC 411 is Tc1, the delay time on a line 416 from the clock IC 413 to a clock terminal of an input IC 412 is Tc2, and the delay on a line 415 from a data terminal of the output IC 411 to a data terminal of the input IC 412 is Td, the setup time Ts and the hold time Th of the input IC 412 (latch) need to satisfy the relationships of the following equations (15) and (16):

$$Tcyc - Tac - Td + (Tc2 - Tc1) > Ts \quad (15)$$

$$Toh + Td - (Tc2 - Tc1) > Th \quad (16).$$

From the equations (15) and (16), $$Th - Toh < Td - (Tc2 - Tc1) < Tcyc - Tac - Ts \quad (17).$$

If, in a PLL circuit of FIG. 4C, the delay time on a line 425 from a clock IC 423 with a PLL to a clock terminal of an output IC 421 is Tc3, the delay time on a line 426 from the clock IC 423 with a PLL to a clock terminal of an input IC 422 is Tc4, the delay on a line 424 from a data terminal of the output IC 421 to a data terminal of the input IC 422 is Td, and the delay on a feedback line 427 of the clock IC 423 with a PLL is Tfb, the setup time Ts and the hold time Th of the input IC 422 (latch) need to satisfy the relationships of the following equations (18) and (19):

$$Tcyc - Tac - Td + (Tc3 + Tc4 - Tfb) > Ts \quad (18)$$

$$Toh + Td - (Tc3 + Tc4 - Tfb) > Th \quad (19).$$

From the equations (18) and (19), $$Th - Toh < Td - (Tc3 + Tc4 - Tfb) < Tcyc - Tac - Ts \quad (20).$$

The center terms Tc, Tc2-Tc1 and Tc3+Tc4-Tfb in the above equations (14), (17) and (20) correspond to differences in the delay of the clock transmitted to the output IC and the delay of the clock transmitted to the input IC. If Tcs is substituted for these delay differences, the above three equations may be expressed by the following equation (21):

$$Th - Toh < Td - Tcs < Tcyc - Tac - Ts \quad (21).$$

For timing design, it is sufficient to extract the delay time of the data signal and that of the clock signal and to check whether or not the above relationship is satisfied.

Meanwhile, the PLL circuit adjusts the phase of the clock output in such a manner as to take up the phase difference between the clock input (input of Tc3 of FIG. 4C) and the feedback input of the PLL circuit (input of Tfb of FIG. 4C). Hence, by setting so that $$Tc3 + Tc4 = Tfb \quad (22)$$

the phase difference (delay time) between the clock output of the output IC and the clock input of the input IC, equal to zero, may be realized, based on the function of the PLL circuit.

Meanwhile, with the PLL circuit, timing cannot be verified by the wiring delay only. With the present example, the IC having the PLL is afforded with an attribute at the time of preparing a component timing database (102 of FIG. 1).

In case the PLL attribute is detected in the component timing database (102 of FIG. 1), in the present example, the delay time as from clock output from the IC until clock input to the PLL (Tc3 of FIG. 4) minus the feedback delay (Tfb of FIG. 4) corresponds to the clock delay.

When the above check has come to a close for all ICs having component timing databases (102 of FIG. 1), the design is completed in its entirety.

With the present example, it is possible to automatically judge the connectability among components by simply registering the AC specifications, extracted from the component datasheets, in the component databases (102 of FIG. 1). Hitherto, the connectability is checked by a circuit designer as he or she checks the datasheet. Hence, the load on the circuit designer is considerable. With the present example, the load on the circuit designer would be moderated if the preparation of a component database (102 of FIG. 1) is taken charge of by a specialized full-time staff member.

If, in place of an individual circuit designer taking charge of preparation of a timing database, the timing database is provided instead of a datasheet by a component vendor, and distributed to component users, the database is improved in reliability, whilst problems related with components or design may be moderated. This would be favorable for both the component makers and device makers.

Although not directly relevant to the theme of the present invention, a model for transmission simulation IBIS (Input/Output Buffer Information Specification) has become a de-facto standard and thus provides an environment that allows for simulation freely. It would be convenient if there is similar environment as regards the timing conditions.

Up to now, in layout design, a circuit designer adds mounting constraint conditions, and a layout designer carries out the layout design. According to the present invention, design assuring quality may be realized without adding mounting constraint conditions.

As described above, one of the features of the present example resides in preparing a timing database in connection with the timing condition. The addition of a signal interface level in the timing database, for example, may extend the range of the applicability of the present example in the collation of design validity. Although the PLL attribute is separately defined, it may also be combined into other attributes.

In the above description of the preferred example, the circuit design and layout design are assumed to be carried out as an integrated operation. It is however also possible to use the layout design of FIG. 1 for floor planning (check to be made before layout design).

Meanwhile, in FIG. 1, the steps of preparation of the timing database (S1), extraction of connection information (S4), verification as to whether or not connection of components is possible from timing perspective (S5), extraction of wiring delay information (S7) and check as to timing constraints on data and clock lines among components (S8), may, of course, be carried out automatically. The circuit design and the layout design may also be carried out automatically, using a tool for circuit design and that for layout design, semi-automatically, with the help by a designer, or partially manually.

Although the present invention has so far been described with reference to preferred examples, the present invention is not to be restricted to the examples. It is to be appreciated that those skilled in the art can change or modify the examples without departing from the scope and spirit of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for designing a printed circuit board for an electronic circuit comprising:
    creating a timing database including terminal information, input/output attribute and timing information relating to a selected component;
    generating a circuit diagram based on circuit design information;
    extracting connection information of a component from said circuit diagram, and
    performing timing verification, with reference to said timing database, to check whether or not the component is connectable from timing perspective;
    carrying out layout design of the printed circuit board, inclusive of placement and routing of a component which is decided to be connectable as a result of said timing verification;
    extracting respective line lengths of a data line and a clock line in said printed circuit board obtained by said layout design from a net list and layout information thereof to derive respective wiring delay times of said data line and said clock line; and
    checking, with reference to the wiring delay times derived and the timing database, whether or not delays on the data line and the clock line satisfy a preset timing constraint.

2. The method according to claim 1, wherein, if as a result of the timing verification, said component is decided to be not connectable, another component is selected and the step for creating a timing database including terminal information, input/output attribute and timing information relating to another component selected is executed.

3. The method according to claim 1, wherein it is checked in said timing verification whether or not a valid pulse width of an output buffer of a component that outputs data is larger than the sum of a setup time and a hold time of an input buffer of a component that receives the data.

4. The method according to claim 1, wherein, in case a clock cycle is Tcyc; and
    as the timing information of the component stored in said timing database, a setup time of an input buffer of the component that receives data, is Ts,
    a hold time of the input buffer of the component that receives data, is Th,
    an output hold time of an output buffer of the component that outputs data, is Toh, and
    an access time of the output buffer of the component that outputs data, is Tac; and in case
    said wiring delay times derived include:
    a delay Td of the data line between the component outputting the data and the component receiving the data, and
    a delay Tcs of the clock line between the component outputting the data and the component receiving the data;
    said checking whether or not the delay on said data line and said clock line satisfies said timing constraint is performed by checking whether or not Th−Toh<Td−Tcs<Tcyc−Tac−Ts holds.

5. The method according to claim 1, wherein if, as a result of the checking whether or not delays on the data line and the clock line satisfy a preset timing constraint, the component is decided to be not proper, the layout design including placement and routing of said component is again carried out.

6. A system for designing a printed circuit board for an electronic circuit comprising: a first means that creates a timing database including terminal information, input/output attribute and timing information relating a selected component;
    a second means that extracts connection information of a component from a circuit diagram that has been generated based on circuit design information, and performs timing verification, with reference to said timing database, to check whether or not the component is connectable from timing perspective;
    a third means that extracts respective line lengths of a data line and a clock line from a net list and layout information of a printed circuit board that has been layout-designed to derive respective wiring delay times of said data line and said clock line; and a fourth means that checks, with reference to the wiring delay times derived and the timing database, whether or not delays on the data line and the clock line satisfy a preset timing constraint.

7. The system according to claim 6, wherein, when said second means decides as a result of said timing verification that the component is be not connectable, a timing database including terminal information, input/output attribute and timing information relating to another component selected anew is created.

8. The system according to claim 6, wherein said second means checks whether or not a valid pulse width of an output buffer of a component that outputs data is larger than the sum of a setup time and a hold time of an input buffer of a component that receives the data.

9. The system according to claim 6, wherein said fourth means receives information on an operating frequency, wherein, in case the clock cycle is Tcyc; and as the timing information of the component stored in said timing database, a setup time of an input buffer of the component that receives data, is Ts, a hold time of the input buffer of the component that receives data, is Th, an output hold time of an output buffer of the component that outputs data, is Toh, and an access time of the output buffer of the component that outputs data, is Tac; and in case said wiring delay times derived include a delay Td of the data line between the component outputting the data and the component receiving the data, and a delay Tcs of the clock line between the component outputting the data and the component receiving the data, said checking by said fourth means whether or not the delay on said data line and said clock line satisfies said timing constraint is performed by checking whether or not Th−Toh<Td−Tcs<Tcyc−Tac−Ts holds.

10. The system according to claim 6, wherein if as a result of checking by said fourth means, a component is decided to be not proper, the layout design including placement and routing of said component is again carried out.

11. A system for designing a printed circuit board for an electronic circuit comprising:

first means that extracts respective wiring lengths of a data line and a clock line for at least a first component and a second component of an electronic circuit being layout designed or following layout design, from a net list and layout information; wherein said first component outputs data responsive to a clock signal and said second component samples the data responsive to the clock signal;

said first means deriving wiring delay time of said data line and wiring delay time of said clock line; and second means that verifies, from the wiring delay times derived, timing information of said first and second components and information on operating frequency thereof, whether or not the delay on said data line and said clock line between said first and second components satisfies a preset timing constraint.

12. The system according to claim 11, further comprising:

third means that performs timing verification of the component, before proceeding to layout design of the printed circuit board, based on connection information of the component and timing information to check whether or not said first and second components are connectable to each other.

13. The system according to claim 12, wherein said third means judges that said first and second components are connectable to each other when the valid pulse width of said first component is larger than the sum of a setup time and a hold time of said second component.

14. The system according to claim 11, wherein in case a clock cycle is Tcyc; and as AC characteristics of said first and second components, a setup time of said second component is Ts, a hold time of said second component is Th, and an output hold time of said first component is Toh, and an access time of said first component is Tac; and in case the delay of a data line between said first and second components is Td, and the delay of a clock line between said first and second components is Tcs;

said second means checks whether or not Th−Toh<Td−Tcs<Tcyc−Tac−Ts holds, to verify whether or not the timing constraint for said first and second components is met.

15. A printed circuit board design apparatus including the system according to claim 11, said apparatus being used for placement and routing of electronic components on a printed circuit board.

* * * * *